US008570082B1

(12) United States Patent
Kuo et al.

(10) Patent No.: US 8,570,082 B1
(45) Date of Patent: Oct. 29, 2013

(54) PVT-FREE CALIBRATION CIRCUIT FOR TDC RESOLUTION IN ADPLL

(71) Applicant: Taiwan Semiconductor Manufacturing Co. Ltd., Hsin-Chu (TW)

(72) Inventors: Feng Wei Kuo, Zhudong Township (TW); Kuang-Kai Yen, Kaohsiung (TW); Huan-Neng Chen, Taichung (TW); Hsien-Yuan Liao, Huatan Township (TW); Lee Tsung Hsiung, New Taipei (TW); Chewn-Pu Jou, Hsinchu (TW); Robert Bogdan Staszewski, PA Delft (NL)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/778,478

(22) Filed: Feb. 27, 2013

(51) Int. Cl.
*H03L 7/06* (2006.01)
(52) U.S. Cl.
USPC .......................................................... 327/158
(58) Field of Classification Search
USPC ................................................. 327/147, 158
See application file for complete search history.

(56) References Cited

U.S. PATENT DOCUMENTS

| | | | |
|---|---|---|---|
| 2008/0315928 A1 | 12/2008 | Waheed et al. | |
| 2008/0315959 A1 | 12/2008 | Zhuang et al. | |
| 2008/0315960 A1* | 12/2008 | Waheed et al. | 331/17 |
| 2009/0096539 A1* | 4/2009 | Chang et al. | 331/1 A |
| 2010/0144333 A1* | 6/2010 | Kiasaleh et al. | 455/418 |
| 2010/0277244 A1* | 11/2010 | Chang et al. | 331/16 |
| 2011/0148676 A1* | 6/2011 | Waheed et al. | 341/131 |
| 2011/0234326 A1* | 9/2011 | Kobayashi | 331/1 A |
| 2013/0002317 A1* | 1/2013 | Frantzeskakis et al. | 327/156 |
| 2013/0099839 A1* | 4/2013 | Kao et al. | 327/158 |

OTHER PUBLICATIONS

Ni Xu, et al.; "Semidigital PLL Design for Low-Cost Low-Power Clock Generation"; Hindawi Publishing Corporation, Journal of Electrical Computer Engineering, vol. 2011, Article ID 235843, May 15, 2011, p. 1-9.
Michael H. Perrott, "Tutorial on Digital Phase-Locked Loops"; CICC 2009; p. 1-118.

* cited by examiner

*Primary Examiner* — Adam Houston
(74) *Attorney, Agent, or Firm* — Eschweiler & Associates, LLC

(57) ABSTRACT

The present disclosure relates to an all digital phase locked loop (APDLL) that can account for variations in PVT conditions, and a related method of formation. In some embodiments, the ADPLL has a controllable time-to-digital converter (TDC) having a plurality of variable delay elements. The controllable TDC is determines a phase difference between a frequency reference signal and a local oscillator clock signal and to generate a phase error therefrom. A digitally controlled oscillator (DCO) varies a phase of the local oscillator clock signal based upon the phase error. A calibration unit determines an effect of variations in PVT (process, voltage, and temperature) conditions based upon the phase error and to generate a TDC tuning word that adjusts a delay introduced by one or more of the plurality of variable delay elements to account for the variations in PVT conditions.

20 Claims, 7 Drawing Sheets

500 ⇘

| TDC RESOLUTION | PHASE ERROR | TTW |
|---|---|---|
| 4.5 ps | +/-0.2 | 228 |
| 5 ps | +/-0.15 | 188 |
| 6.5 ps | +/-0.1 | 148 |
| 7 ps | +/-0.01 | 128 |
| 7.5 ps | +/-0.1 | 108 |
| 8 ps | +/-0.15 | 68 |
| 8.5 ps | +/-0.2 | 28 |

PVT-FREE CALIBRATION CIRCUIT FOR TDC RESOLUTION IN ADPLL

BACKGROUND

An all-digital phase locked loop (ADPLL) is a circuit that locks the phase of a local oscillator clock signal, output from the ADPLL, to the phase of a frequency reference signal. An ADPLL operates as a feedback system that feeds a local oscillator clock signal (CKV) back to a time-to-digital (TDC). The TDC detects a phase difference between the local oscillator clock signal and a frequency reference (FREF), and in response to the detected phase difference drives a local oscillator to adjust the phase of the local oscillator clock signal.

ADPLLs are configured to operate in two states, an unlocked or settling state and a locked or settled state. In the unlocked state, the TDC generates a control signal that changes the frequency of the local oscillator so that the phase of the local oscillator clock signal converges upon the phase of the frequency reference signal. In the locked state, the TDC generates a control signal that keeps the phases of the frequency reference signal and the local oscillator clock signal together.

DETAILED DESCRIPTION

Figure 1A:
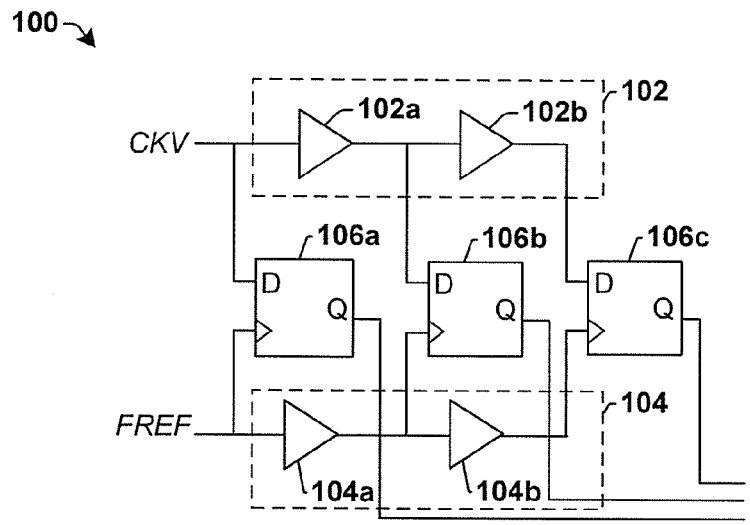
FIGS. 1A-1B illustrate operation of a time-to-digital converter (TDC) in an all digital phase locked loop (ADPLL).

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

An all digital phase locked loop (ADPLL) may comprise a time-to-digital converter (TDC) configured to determine a phase difference between edges of a frequency reference FREF and a local oscillator clock signal CKV. FIG. 1A illustrates a block diagram of an exemplary TDC 100. TDC 100 comprises a first delay path 102 having a plurality of delay elements (e.g., inverters) 102a-102b and a parallel, second delay path 104 having a plurality of delay elements 104a-104b. Respective delay elements 102a-102b in the first delay path 102 are configured to provide a first delay into a local oscillator clock signal CKV and respective delay elements 104a-104c in the second delay path 104 are configured to provide a second delay, different than the first delay, into a frequency reference FREF. A plurality of flip-flops 106a-106c, positioned between the first delay path 102 and the second delay path 104, are configured to compare the CKV and FREF signals output from each delay element to generate a multi-bit digital control word indicative of a phase difference between FREF and CKV.

Figure 1B:
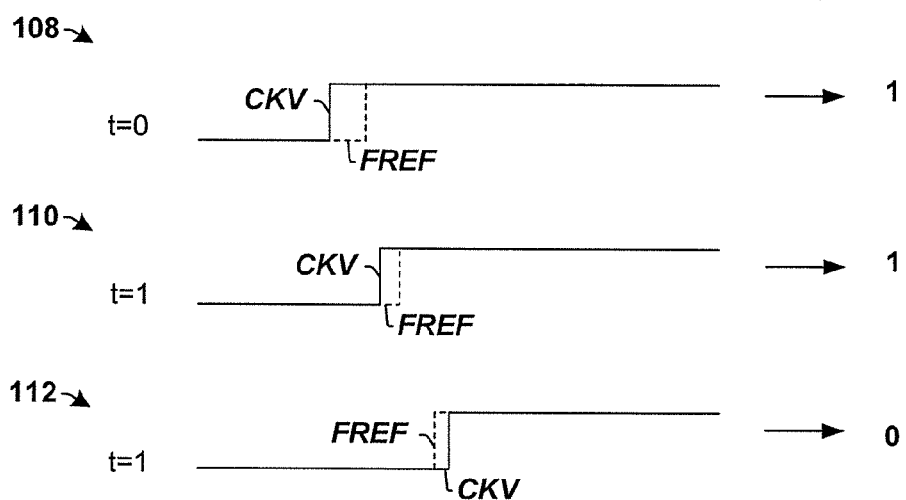

For example, as shown in timing diagrams 108-112 of FIG. 1B, the TDC will output a digital word based upon edges of the delayed CKV and FREF signals. For example, if a CKV signal is leading an FREF signal, an associated flip-flop will output a bit having a value of 1 as shown in timing diagrams 108-110. Alternatively, if a CKV signal is lagging an FREF signal, an associated flip flop will output a bit having a value of 0 as shown in timing diagram 112. The control word controls a digitally controlled oscillator that varies a phase of the local oscillator clock signal CKV, so as to align edges of the FREF and CKV signals.

Time-to-digital converters are sensitive to variations in PVT (process, voltage and temperature) conditions, which can cause delay elements within a TDC to have varying delays. For example, typical delay time variation of a single inverter may exhibit nearly 50% variation over process and temperature. Such variations in the delay can hurt TDC resolution, increasing in-band noise in the ADPLL Accordingly, the present disclosure relates to an all digital phase locked loop (APDLL) that can account for variations in PVT conditions, and a method of related method of formation. The disclosed ADPLL comprises a controllable time-to-digital converter (TDC) having a plurality of variable delay elements. The controllable TDC is configured to determine a phase difference between a frequency reference signal and a local oscillator clock signal and to generate a variable phase therefrom. A digitally controlled oscillator (DCO) is configured to vary the phase of the local oscillator clock signal based upon the variable phase. A calibration unit is configured to determine an effect of variations in PVT (process, voltage, and temperature) conditions based upon the variable phase and to generate a TDC tuning word that adjusts a delay introduced by one or more of the plurality of variable delay elements to account for the variations in PVT conditions.

Figure 2:
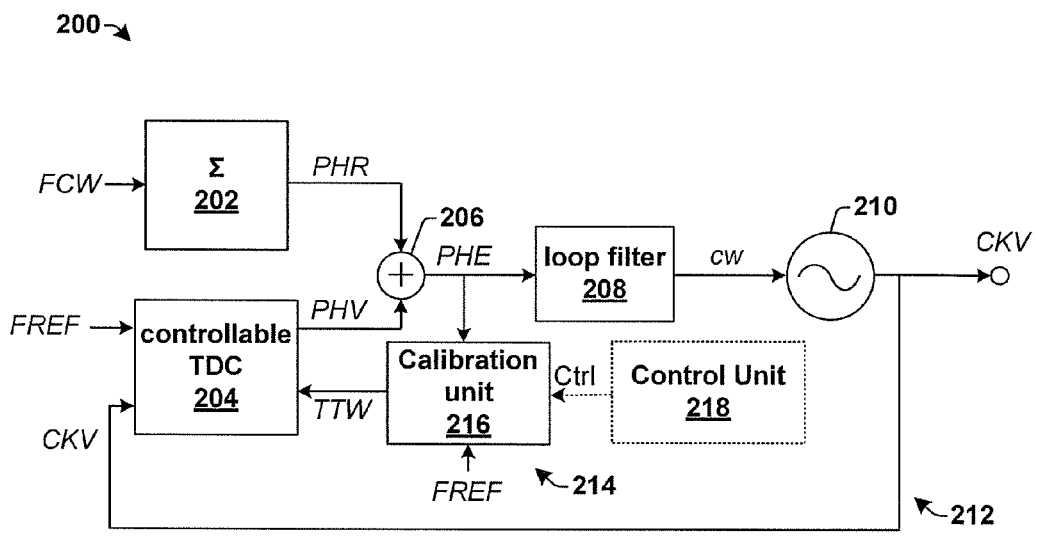
FIG. 2 illustrates a block diagram of some embodiments of a disclosed all digital phase locked loop (ADPLL) having a calibration unit configured to account for variations in PVT (process, voltage, and temperature) conditions.

FIG. 2 illustrates a block diagram of some embodiments of a disclosed all digital phase locked loop (ADPLL) 200.

ADPLL 200 comprises a reference phase accumulator 202 configured to receive a frequency command word FCW (i.e., a ratio of a desired RF carrier frequency divided by a frequency of a frequency reference FREF; $FCW = f_{RF}/f_{FREF}$). In some embodiments, the reference phase accumulator 202 is configured to accumulate the FCW over time and to output the accumulated FCW as a reference phase signal PHR. The reference phase signal PHR is provided, by way of a summation element 206 and a digital loop filter 208, to a digitally controlled oscillator (DCO) 210 that establishes a local oscillator clock signal CKV.

A first feedback loop 212 is configured to provide the local oscillator clock signal CKV to a controllable time-to-digital converter (TDC) 204 comprising a plurality of variable delay elements. The controllable TDC 204 is configured to receive the local oscillator clock signal CKV and the frequency reference FREF. Controllable TDC 204 is configured to quantize a time difference between edges of the CKV and FREF signals, and to generate a variable phase PHV based upon the quantized time difference. The variable phase PHV is provided to summation element 206, which is configured to detect a phase difference between the reference phase PHR and variable phase PHV and therefrom to generate a phase error PHE.

The phase error, PHE, is provided to a digital loop filter 208, which is configured to generate a control word cw from the phase error PHE. The control word cw is provided to DCO 210 as a frequency tuning word. Based upon the control word cw, the DCO 210 is configured to vary a frequency of the local oscillator clock signal CKV. Over a plurality of clock cycles, the control word cw drives the ADPLL 200 to enter a locked state by minimizing (i.e., settling) the phase error PHE.

In some embodiments, variations in PVT (i.e., process, voltage, and temperature) conditions may drive differences in operating parameters (e.g., oxide thickness, effective channel length, doping concentration, etc.) of devices within the controllable TDC 204. Therefore, the ADPLL 200 further comprises a second feedback path 214, extending from the output of summation element 206 to controllable TDC 204, which comprises a calibration unit 216 configured to compensate for variations in PVT conditions that affect operation of the controllable TDC 204. The calibration unit 216 is configured to perform TDC calibration to keep a resolution of the controllable TDC 204 independent of the impact of PVT conditions (i.e., to keep the same TDC resolution over varying PVT conditions).

For example, controllable TDC 204 may have devices formed by a process having a fast-fast (FF) process corner. Such devices may cause the controllable TDC 204 to have a higher resolution and power consumption than designed. Alternatively, the controllable TDC 204 may have devices formed by a process having a slow-slow (SS) process corner. Such devices may cause the controllable TDC 204 to have a lower resolution and lower power consumption than designed. By accounting for PVT variations caused by devices in a FF or SS process corner, the calibration unit 216 improves the linearity of the controllable TDC 204, while reducing the in-band noise and power consumption of the ADPLL 200.

In some embodiments, the calibration unit 216 is configured to account for variations in PVT conditions by monitoring the phase error PHE, and depending upon the monitored phase error PHE to generate a TDC tuning word (TTW) that varies a delay of one or more variable delay elements within the controllable TDC 204. The calibration unit 216 is able to detect the effect of PVT variations based upon the phase error PHE, since the phase error PHE is generated from the variable phase PHV (which is generated by the PVT dependent controllable TDC 204, and therefore varies based upon changes in PVT conditions).

For example, in some embodiments, the calibration unit 216 is configured to generate a multi-bit digital TDC tuning word (TTW), based upon a phase error PHE, which varies a resolution of the controllable TDC 204 in a manner that accounts for (e.g., mitigates) the phase difference to compensate for variations in PVT conditions in the ADPLL 200. By varying the resolution of the controllable TDC 204 the TDC resolution can be kept at a substantially same value under different PVT conditions, reducing in-band noise of the ADPLL.

In some embodiments, a control unit 218 is configured to selectively operate the calibration unit 216. For example, in some embodiments, the control unit 218 is configured to turn off the calibration unit 216 while the ADPLL 200 is in a settling stage. Upon reaching a settled stage, the control unit 218 is configured to active the calibration unit 216 to compensate for the effects of PVT conditions in the ADPLL 200.

The control unit 218 may also be configured to selectively provide power to the calibration unit 216 so long as the PVT conditions of the ADPLL 200 are not stable. For example, when the control unit 218 determines that the PVT conditions of the ADPLL are not stable, the control unit 218 is configured maintain power for the calibration unit 216 since TDC calibration. However, when the control unit 218 determines that the PVT conditions of the ADPLL are stable, the control unit 218 is configured to turn power off for the calibration unit 216 since TDC calibration is no longer needed to compensate for PVT conditions. By selectively turning off power of the calibration unit 216, power consumption of the ADPLL 200 is reduced.

Figure 3:
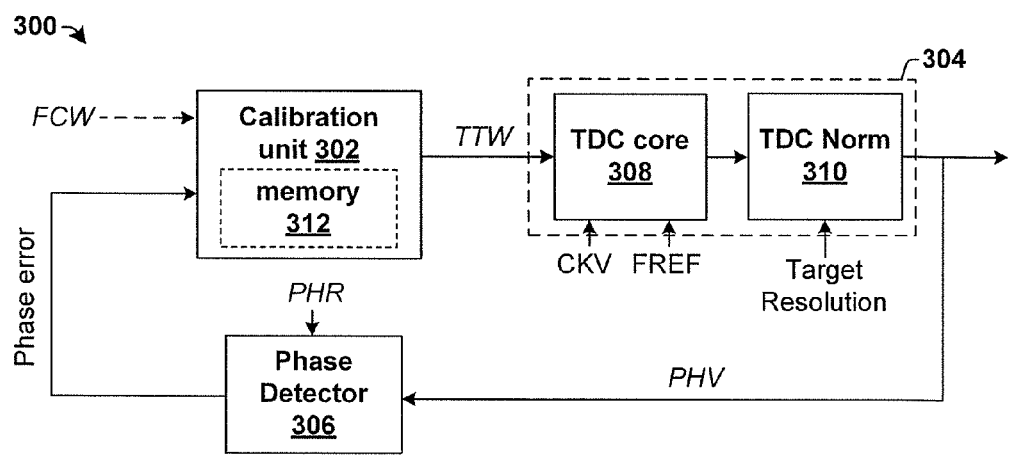
FIG. 3 illustrates a block diagram of some embodiments of a more detailed example of a feedback path of a disclosed APDLL comprising a disclosed calibration unit and a controllable TDC.

FIG. 3 illustrates a block diagram of some embodiments of a more detailed example of a second feedback path 300 (e.g., corresponding to second feedback path 214) of a disclosed APDLL. The second feedback path 300 comprises a calibration unit 302, a controllable time-to-digital converter (TDC) 304, and a phase detector 306.

The controllable TDC 304 comprises a TDC core 308 and a normal TDC 310. The TDC core 308 is configured to receive a local oscillator clock signal CKV, a frequency reference FREF, and a TDC tuning word (TTW). The TDC core 308 determines a time difference between the positive edge of the frequency reference FREF and the local oscillator clock signal CKV. The time difference is output to the normal TDC 310 as a TDC control signal comprising a digital code. The normal TDC 310 is configured to transform the time difference into a variable phase PHV. In some embodiments, the normal TDC 310 transforms the time difference into the variable phase PHV by comparing a TDC resolution output from the TDC core 308 to a target resolution. If the TDC resolution is not equal to the target resolution, the normal TDC 310 will induce a variable phase PHV proportional to a difference between the target resolution and the TDC resolution.

The variable phase PHV is provided to the phase detector 306, which determines a phase error between the variable phase PHV and a reference phase PHR (e.g., output from reference phase accumulator 202). In some embodiments, the phase detector comprises a summation element (e.g., corresponding to summation element 206).

The phase error is provided to the calibration unit 302. Since the variable phase PHV is output from TDC 304, the variable phase PHV will be impacted by PVT conditions because the resolution (e.g., delays) of the TDC 304 is impacted by PVT conditions. Therefore, the calibration unit 302 is able to determine an impact of the PVT conditions from the variable phase PHV and to generate a TDC tuning word (TTW) that accounts for the impact of the PVT conditions.

For example, in some embodiments, the calibration unit 302 may be configured to receive a frequency command word (FCW) and the phase error. The calibration unit 302 is configured to compare the phase error to the FCW (e.g., to a FREF determined from the FCW), and to generate a TTW based upon the comparison. The phase error has a determinable relationship with the FCW once the ADPLL has been settled. However, since the variable phase PHV is impacted by PVT conditions, and not the FCW is not, the determinable relationship varies, therefore allowing the calibration unit 302 to determine the effect of the PVT conditions on the variable phase PHV and to generate a TTW having a value that varies based upon PVT variations.

The TTW is provided to the TDC core 308, which along with the CKV and the FREF signals is used to generate the TDC control signal. In some embodiments, the TDC core 308 comprises a plurality of programmable delay elements (e.g., inverters) and/or a plurality of switchable capacitors having values controlled by the TTW. In such embodiments, a value of delays introduced by the variable delay elements will change based upon a value of the TTW.

In some embodiments, the calibration unit 302 comprises a memory element 312 configured to store a TTW from a prior clock cycle. For example, once PVT conditions have been properly compensated for (e.g., when the phase error is within a first threshold value of an acceptable phase error), the TTW may be stored in the memory element 312 (e.g., a non-volatile memory element) and the calibration unit 302 may be turned off to conserve power. In some embodiments, the calibration unit 302 is configured to make an adjustment to a prior TTW stored in memory element 312 based upon an adjustment determined from the phase error determined by the phase detector 306. For example, the calibration unit 302 may determine a TTW having a value:

$$TTW(t)=TTW(t-1)+TTW\_adj(PHE)$$

where TTW(t−1) is a TTW value stored in memory element 312 from a prior clock cycle and TTW_adj(PHE) is an adjustment to the TTW determined by the phase error.

Figure 4A:
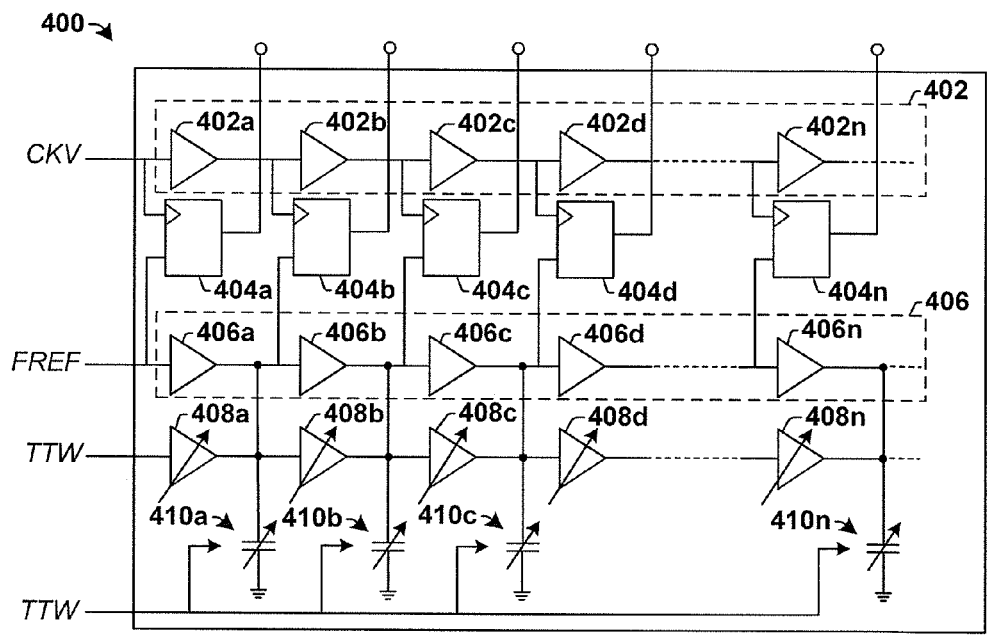
FIGS. 4A-4C illustrates some embodiments of a digitally controlled TDC core.

FIG. 4A illustrates a block diagram of some embodiments of a digitally controlled TDC core 400 having a plurality of variable delay element comprising plurality of programmable delay elements 408a-408n and switchable capacitors 410a-410n.

The digitally controlled TDC core 400 comprises a first delay chain 402 and a second delay chain 406. The first delay chain 402 comprises a plurality of delay elements 402a-402n connected in series to one another. The second delay chain 406 comprises a plurality of delay elements 406a-406n connected in series to one another. The plurality of delay elements 402a-402n are configured to introduce a different delay than the plurality of delay elements 406a-406n.

A plurality of arbiter circuits 404a-404n (e.g., flip-flops) are connected between the first delay chain 402 and the second delay chain 406. The plurality of arbiter circuits 404a-404n are configured to detect a time difference between signals output from delay elements in the first delay chain 402 and the second delay chain 406. A variable delay chain comprising a plurality of programmable delay elements 408a-408n and variable capacitor chain comprising a plurality of switchable capacitors 410a-410n are connected in parallel to the plurality of delay elements 406a-406n in the second delay chain 406.

In some embodiments, the delay of a delay element in the first delay chain 402 may be greater than the delay of a delay element in the second delay chain 406. Therefore, as signals (e.g., CKV and FREF) propagate in their respective delay chains, the time difference between the signals decreases in each stage by the difference in delays. The output of each stage is provided to an arbiter circuit (e.g., a D-type latch) that determines which pulses came first. The position in the delay line, at which a signal that comes first switches, gives information about the phase difference between the signals and provides for a control word that can account for variations in the process.

In some embodiments, the first delay chain 402 is configured to receive a local oscillator clock signal CKV signal and the second delay chain 406 is configured to receive a frequency reference FREF signal. In other embodiments, the first delay chain 402 is configured to receive a frequency reference FREF signal and the second delay chain 406 is configured to receive a local oscillator clock CKV signal.

Variations in PVT conditions change the delay introduced by delay elements within the first and second delay chains, 402 and 406. Since the resolution of the digitally controlled TDC core 400 is determined by a delay of the delay elements, the changes in a value of the delay introduced by the delay elements will change the resolution of the digitally controlled TDC core 400. The programmable delay elements 408a-408n and switchable capacitors 410a-410n are configured to introduce a varying delay into the second delay chain 408 that compensates for the effect of variations in PVT conditions on the digitally controlled TDC core 400.

For example, the plurality of programmable delay elements 408 and switchable capacitors 410 are connected to a bus configured to convey a multi-bit digital TDC tuning word (TTW) that controls operation of the plurality of programmable delay elements 408 and switchable capacitors 410. By varying the value of the programmable delay elements 408 and/or the switchable capacitors 410 the resolution and power consumption of the digitally controlled TDC core 400 can be varied to achieve a desired resolution.

Figure 4B:
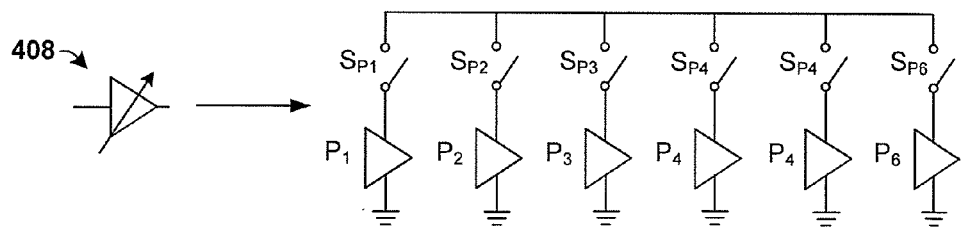

FIG. 4B illustrates an example of some embodiments of a programmable delay element (e.g., corresponding to 408). As illustrated in FIG. 4B, respective programmable delay elements comprise a plurality of delay elements configured in a parallel connection by way of a plurality of switching elements $S_{P1}$-$S_{Pn}$. The TTW is configured to selectively operate one or more of the plurality of switching elements $S_{P1}$-$S_{Pn}$ to vary the delay of the programmable delay element. For example, by closing switches $S_{P1}$-$S_{P3}$ and opening switches $S_{P4}$-$S_{Pn}$ a first delay is achieved, while by closing switches $S_{P1}$-$S_{P5}$ and opening switches $S_{P6}$-$S_{Pn}$ a second delay is achieved.

Figure 4C:
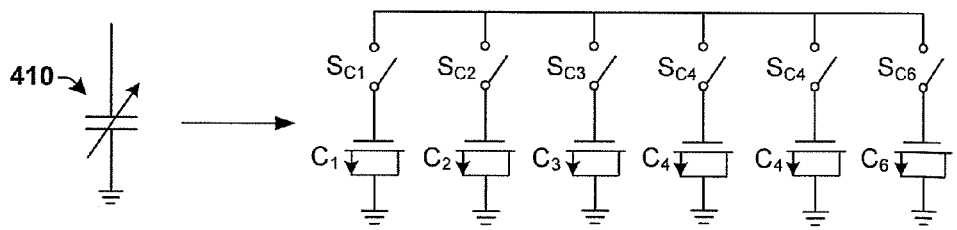

FIG. 4C illustrates an example of some embodiments of a switchable capacitor (e.g., corresponding to 410). As illustrated in FIG. 4C, respective switchable capacitors comprise a plurality of switchable capacitors configured in a parallel connection by way of a plurality of switching elements $S_{C1}$-$S_{Cn}$. The TTW is configured to selectively operate one or more of the plurality of switching elements $S_{C1}$-$S_{Cn}$ to vary the capacitance (and delay) of switchable capacitor. For example, by closing switches $S_{C1}$-$S_{C3}$ and opening switches $S_{C4}$-$S_{Cn}$ a first capacitance (and a first delay) is achieved, while by closing switches $S_{C1}$-$S_{C5}$ and opening switches $S_{C6}$-$S_{Cn}$ a second capacitance (and a second delay) is achieved.

Figures 5, 6:
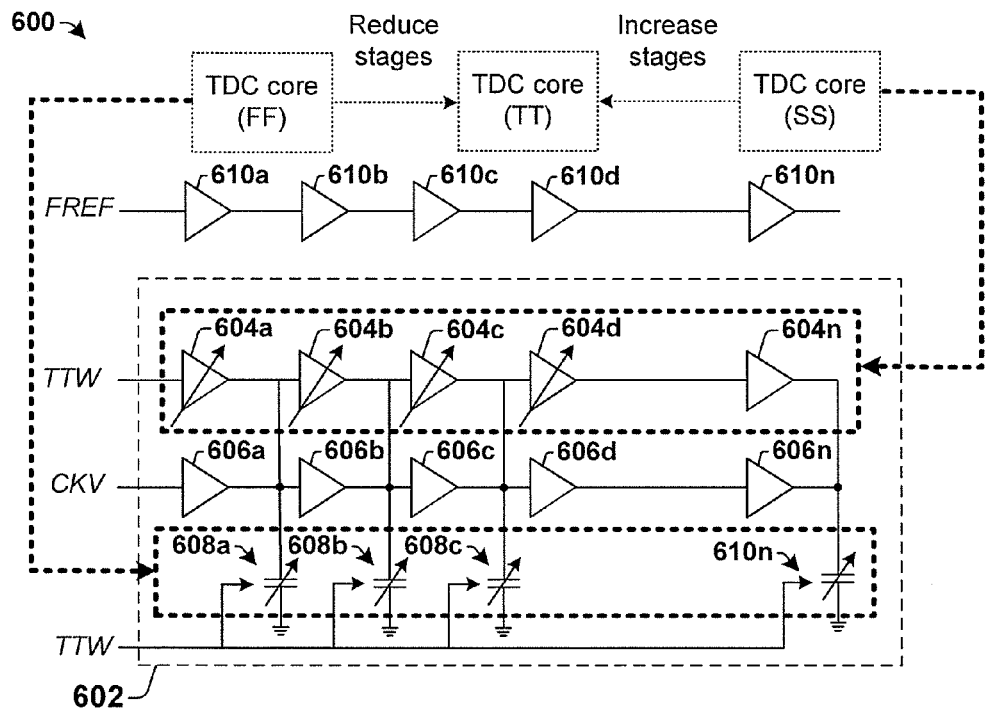
FIG. 5 is a graph showing some embodiments of TDC tuning words and corresponding TDC resolutions.
FIG. 6 illustrates a diagram showing some embodiments of the operation of a TDC core

FIG. 5 is a table 500 showing a TDC resolution as a function of phase error and a TDC tuning word (TTW). Depending on variations of PVT conditions the TDC resolution may vary. The disclosed calibration unit (e.g., calibration unit 302) is configured to detect such variations through the phase error and based upon a detected variations to generate a TTW that adjusts (e.g., increase, decrease) the TDC resolution.

For example, as shown in table 500, a TDC resolution of 7 ps corresponds to a minimum phase error of +/−0.01 that results in a TTW of 128 (i.e., 10000000). Variations in PVT conditions caused by a FF process corner can cause a higher TDC resolution of 5 ps that correspond to a phase error of +/−0.15. To account for the variation in TDC resolution, the calibration unit can generate a TTW from the phase error that has a value of 118 (i.e., 01110110). The TTW will adjust operation of the controllable TDC (e.g., adjust a delay value of one or more delay elements in the TDC core) to account for the variation. Alternatively, variations in PVT conditions caused by a SS process corner can cause a lower TDC resolution of 8 ps that correspond to a phase error of +/−0.15. To account for the variation in TDC resolution, the calibration unit can generate a TTW from the phase error that has a value of 68 (i.e., 01000100). The TTW will adjust operation of the controllable TDC (e.g., adjust a delay value of one or more delay elements in the TDC core) to account for the variation.

It will be appreciated that the disclosed calibration unit may account for variations in PVT conditions by adjusting the delay cells and/or switchable capacitors. For example, if PVT conditions cause a small variation in resolution (e.g., a resolution of 7.5 ps) the delay cells may be adjusted without adjusting the switchable capacitors, while if PVT conditions cause a large variation in resolution (e.g., a resolution of 4.5 ps) the delay cells and capacitors may both be adjusted.

FIG. 6 illustrates a diagram showing operation of some embodiments of a TDC core 602.

TDC core 602 comprises a plurality of programmable delay elements 604a-604n and a plurality of switchable capacitors 608a-608n connected in parallel with a first delay chain having a plurality of delay elements 606a-606n. The first delay chain is configured to receive a local oscillator lock signal CKV, while a second delay chain comprising a plurality of delay elements 610a-610n is configured to receive a frequency reference FREF. In some embodiments, the plurality of programmable delay elements 604a-604n are connected in series to one another and the plurality of switchable capacitors 608a-608n are connected in parallel to nodes located between adjacent programmable delay elements 604a-604n.

The stage number of the TDC core 602 (i.e., the number of active variable delay elements in TDC core 602) is equal to the maximum value of a DCO period divided by the minimum value of TDC resolution. Therefore, there is an inverse relationship between the number of stages and the resolution (i.e., as the number of stages decreases the resolution increases). Therefore, the resolution of the TDC core 602 can be varied by changing the number of stages.

For example, for a process having a fast-fast (FF) process corner the devices within the TDC core 602 work at relatively fast clock speeds. Therefore, the resolution of the TDC core 602 is better (i.e., numerically lower) than designed (e.g., than a TDC operating at a typical-typical (TT) corner). To reduce the power consumption of a TDC core 602 having a FF process corner, the number of stages can be reduced (e.g., by selectively opening one or more switches associated with one or more switchable capacitors 608a-608n) so as to reduce the resolution of the TDC and the power consumption of the TDC core 602.

Similarly, for a process having a slow-slow (SS) process corner the devices within the TDC core 602 work at relatively slow clock speeds. Therefore, the resolution of the TDC core 602 is worse (i.e., numerically higher) than designed (e.g., than a TDC operating at a typical-typical (TT) corner). To increase the resolution of a TDC core 602 having a SS process corner, the number of stages can be increased (e.g., by selectively closing one or more switches associated with one or more programmable delay elements 604a-604n) so as to increase the resolution of the TDC core 602.

In some embodiments, the disclosed TDC calibration unit (e.g., TDC calibration unit 302) is configured to determine a maximum period of a DCO and a target TDC resolution (e.g., depending upon a desired in-band noise). The number of stages can then be determined by dividing the maximum DCO period by a minimum acceptable value of a TDC resolution.

Figure 7:
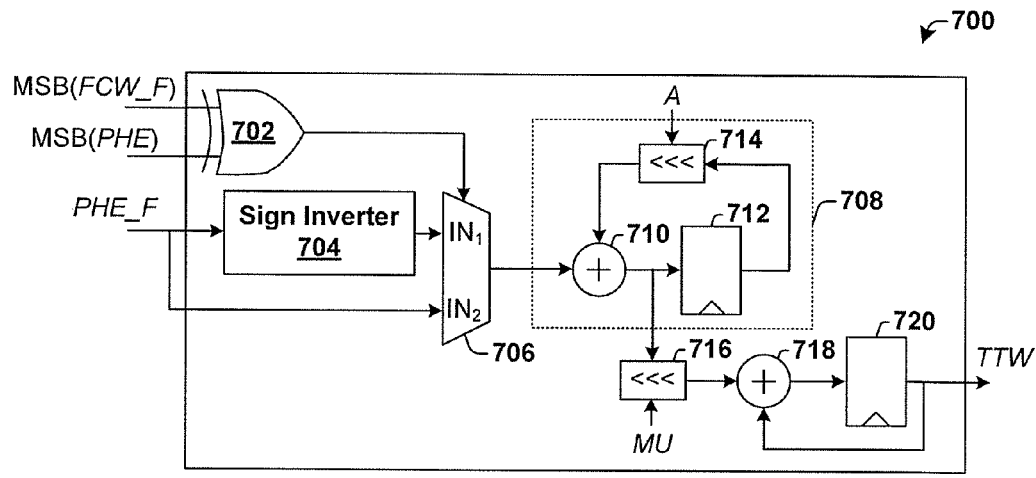
FIG. 7 illustrates a block diagram of some embodiments of a calibration unit.

FIG. 7 illustrates a block diagram of some embodiments of a calibration unit 700.

The calibration unit 700 comprises a logical NOR gate 702 configured to receive a most significant bit (MSB) of a fractional part of a FCW and a most significant bit (MSB) of a phase error. Comparison of the MSBs determines if a TDC tuning word (TTW) output from the calibration unit 700 will increase or decrease the resolution of the controllable TDC. The logical NOR gate 702 is configured to generate an output signal based upon the comparison of the received MSBs.

The output signal of the logical NOR gate 702 is provided to a selection input node of a multiplexor 706. The multiplexor 706 is further comprises a first input node $IN_1$ configured to receive a fractional part of a phase error PHE_F and a second input node $IN_2$ connected to a signal inverter block 704 and configured to receive a fractional part of the phase error having an opposite sign. Depending on the output of the NOR-gate 702, the multiplexor 706 will output a fractional part of the phase error or an inverted value of the fractional part of the phase error to first filtering element comprising an infinite impulse response (IIR) filter 708.

The IIR filter 708 is configured to filter the received signal according to one or more filter coefficients A to generate an error in the TTW. In some embodiments, the IIR filter 708 comprises a summation element 710 and a delay element 712 (e.g., a latch). A filter feedback path extends from the delay element 712 to a filter 714 that is configured to filter the delayed signal (according to filter coefficients A) and provide it to the summation element 710, which generates an error in the TTW by adding the filtered delayed signal to the input signal.

The error in the TTW is provided to a second filtering element 716 that is configured to receive the error in the TTW and to generate an updated TTW from the error. In some embodiments, the second filtering element 716 is configured to filter the error in the TTW according to filter coefficients MU, which corresponds to a step size of the calibration unit (i.e., a size of changes in the TTW). The filtered signal is provided to a summation element 718 and delay element 720. A filter feedback path 722 extends from the delay element 720 to the summation element 718, which generates a TTW by adding the delayed signal to the input signal.

Figure 8:
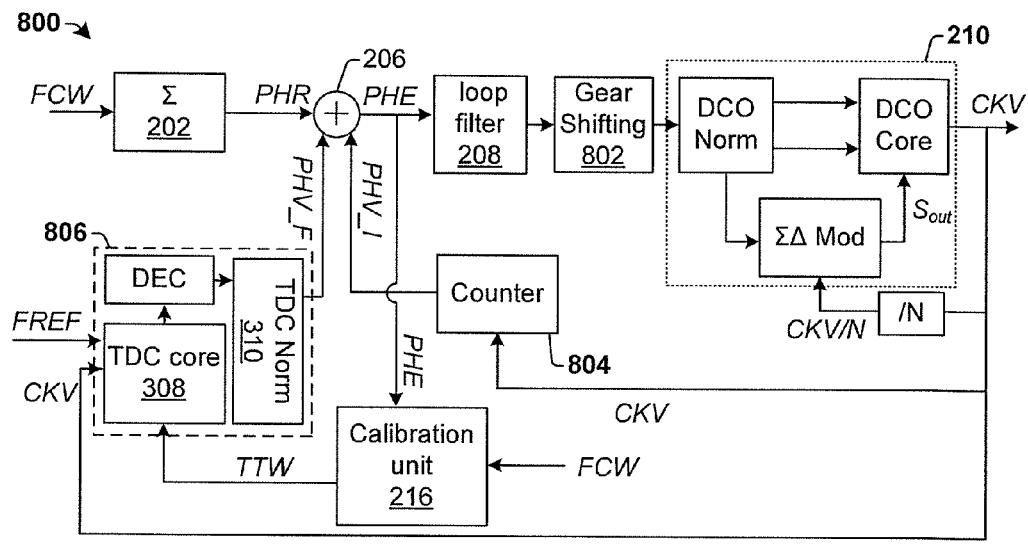
FIG. 8 illustrates a block diagram of some embodiments of a more detailed example of a disclosed APDLL.

FIG. 8 illustrates a more detailed example of some embodiments of a disclosed all digital phase locked loop (ADPLL) 800.

ADPLL 800 comprises a reference phase accumulator 202 configured to provide a reference phase PHR to a summation element 206. The summation element 206 is configured to compare the reference phase PHR to a fractional part of an integer variable phase PHV_F which is received from a controllable TDC 806. Based upon the comparison, the summation element 206 generates a phase error PHE.

The phase error, PHE, is provided to a digital loop filter 208. The digital loop filter 208 is configured to generate a control word cw based upon the phase error. In some embodiments, the digital loop filter 208 is configured to selectively perform type-I and type-II frequency settling. For example, the digital loop filter 208 may be configured to operate in a type-I ADPLL frequency settling mode to enable quick frequency settling. In the type-I ADPLL frequency settling mode, the phase error is provided to one or more FIR filters within the digital loop filter 208. Once the frequency has been settled, the digital loop filter 208 may be configured to switch to a type-II ADPLL phase settling to enable higher order signal and noise filtering. In the type-II ADPLL frequency settling mode, the phase error is provided to one or more IIR filters.

The control word cw is provided to a gear shifting element 802 (e.g., a single gear shifting element or a double gear shifting element) configured to shift between an initial loop gain value and a final loop gain value. The gear shifting element 802 controls operation of a digitally controlled oscillator (DCO) 210. The DCO outputs a local oscillator clock signal CKV.

The local oscillator clock signal CKV is provided to a counter 804, which increments on each active edge (i.e., rising or falling) of the local oscillator clock signal CKV to produce an integer variable phase, PHV_I, which is provided to summation element 206. The local oscillator clock signal CKV is also provided to the TDC core 308, which determines a time difference between the positive edge of the frequency reference FREF and the local oscillator clock signal CKV. The time difference is output to the normal TDC 310 as a TDC control signal comprising a digital code.

In some embodiments, the output of the TDC core 308 is provided to the normal TDC 310 by way of a decimation filter 810. The decimation filter 810 may comprise a low pass filter (e.g., having a pass band below 100 Hz) configured to reduce a sampling rate of the signal output from the TDC core 308. The normal TDC 310 transforms the time difference into the fractional part of the integer variable phase PHV_F which is provided to summation element 206. The summation element 206 adds the fractional part of the variable phase, to the integer part of the variable phase and the reference phase to generate a phase error PHE.

The phase error PHE is provided to the calibration unit 216, which is configured to compare the phase error PHE to a frequency control word FCW. From the comparison, the calibration unit 216 generates a TDC tuning word (TTW) that is provided to the TDC core 308. The TTW varies the delay of one or more variable delay elements within the TDC core 308, as explained above.

Figure 9:
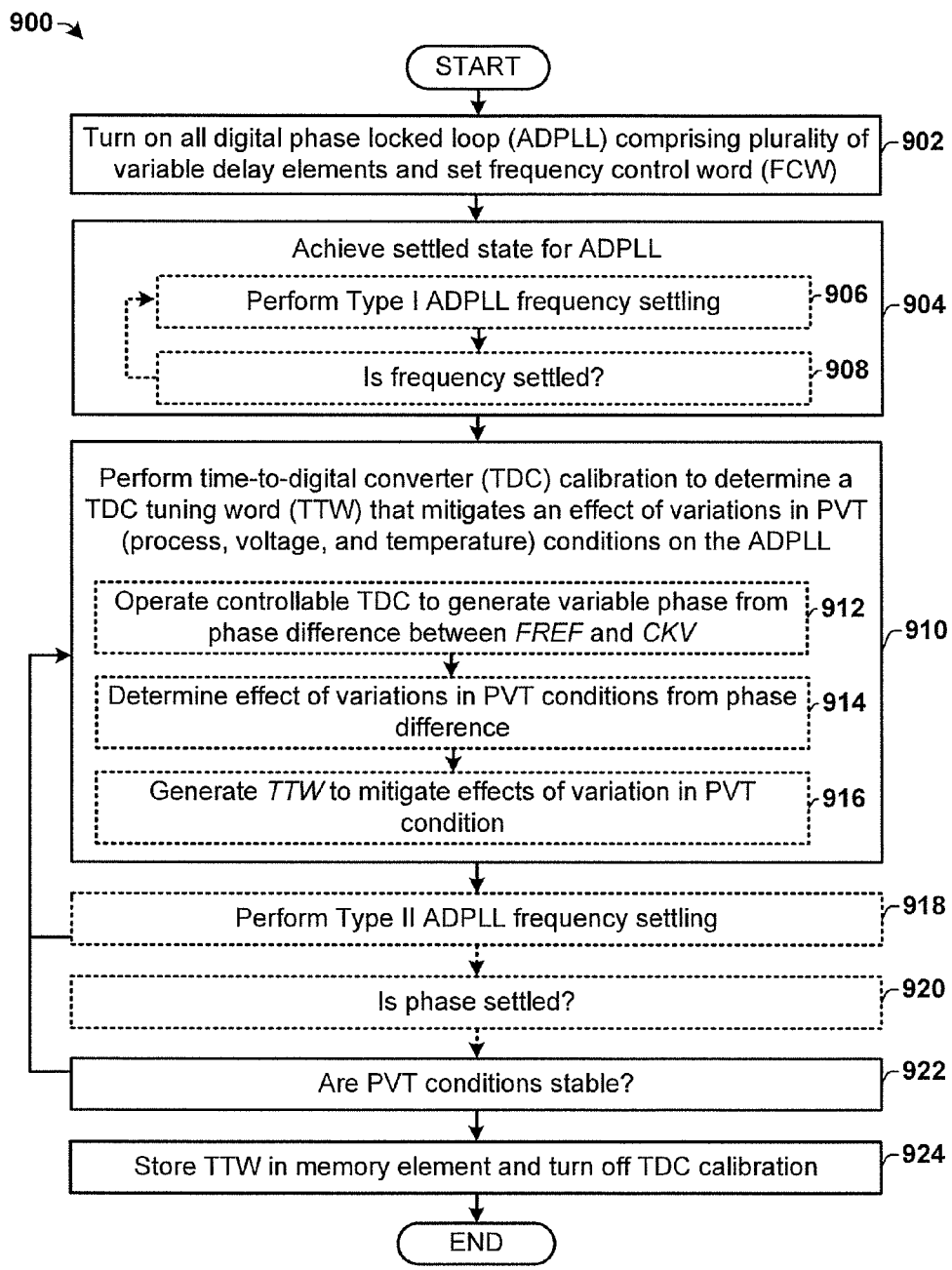
FIG. 9 is a flow diagram of some embodiments of a method of operating an ADPLL to mitigate the effect of variations in PVT conditions.

FIG. 9 is a flow diagram of some embodiments of a method 900 of operating an all digital phase locked loop (ADPLL) to mitigate variations due to PVT conditions.

While the disclosed method 900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 902, an all digital phase locked loop (ADPLL) comprising a plurality of variable delay elements is turned on and a frequency command word (FCW) is set to a value. Turning on the ADPLL provides power to the APDLL. The FCW defines a desired frequency of the APDLL At act 904, the APDLL achieves a settled state. In the settled state, the phase of the output of the APDLL, CKV, and the phase of the FCW are equal.

In some embodiments, the APDLL is settled by performing a type-I ADPLL frequency settling, at 906. Type-I ADPLL frequency settling (i.e., having a single integrating pole achieved using FIR filters in the ADPLL) provides for a relatively fast frequency/phase acquisition during a settling stage of the APDLL operation. At act 908, the TDC calibration determines if the phase is settled. If the frequency is not settled, the type-I ADPLL frequency settling (act 906) is repeated until the frequency is settled. If the frequency is settled, the method 900 proceeds to act 910.

At act 910, a time-to-digital converter (TDC) calibration is performed. The TDC calibration determines an effect of variations in PVT conditions on the ADPLL and generates a TDC tuning word (TTW) that mitigates the effects. In some embodiments, the TDC calibration determines an effect of variations in PVT conditions.

In some embodiments, the TDC calibration is performed by measuring a phase error between a variable phase PHV output from a time-to-digital converter (TDC) and a frequency reference signal FREF, at act 912. The affect of variations in PVT conditions are determined from the phase error, at act 914. The TTW is generated based upon the determined affects that adjusts a resolution of the controllable TDC to mitigate an effect of the variation in PVT conditions, at act 916. In some embodiments, the TTW_adjusts a delay introduced by one or more of the plurality of variable delay elements within the controllable TDC to mitigate the effect of the variations in PVT conditions.

At act 918, a type-II ADPLL frequency settling may optionally be performed. Type-II ADPLL frequency settling (i.e., having a single integrating pole achieved using FIR filters in the ADPLL) provides for higher order signal and noise filtering during a settled stage of the APDLL operation.

At act 920, the method 900 may optionally determine if the phase is settled. In some embodiments, the method determines if the phase is settled by comparing the phase error to a first predetermined threshold value. If the phase is settled the method 900 proceeds to act 922. If the phase is not settled, the method 900 returns to act 910.

At 922, the method 900 determines if the PVT conditions are settled. In some embodiments, the method determines if the PVT conditions are settled by comparing the phase error to a second predetermined threshold value. If the PVT conditions are settled the method 900 proceeds to act 924. If the PVT conditions are not settled the method 900 returns to act 910 where another TTW word is generated to account for PVT variations.

At 924, a current TTW is stored in a memory element and the TDC calibration may be turned off. Since the PVT conditions are stable, the current TTW will not change and therefore changes to the current TTW will occur. Furthermore, by turning of the TDC calibration, the method conserves power of the APDLL.

Figure 10:
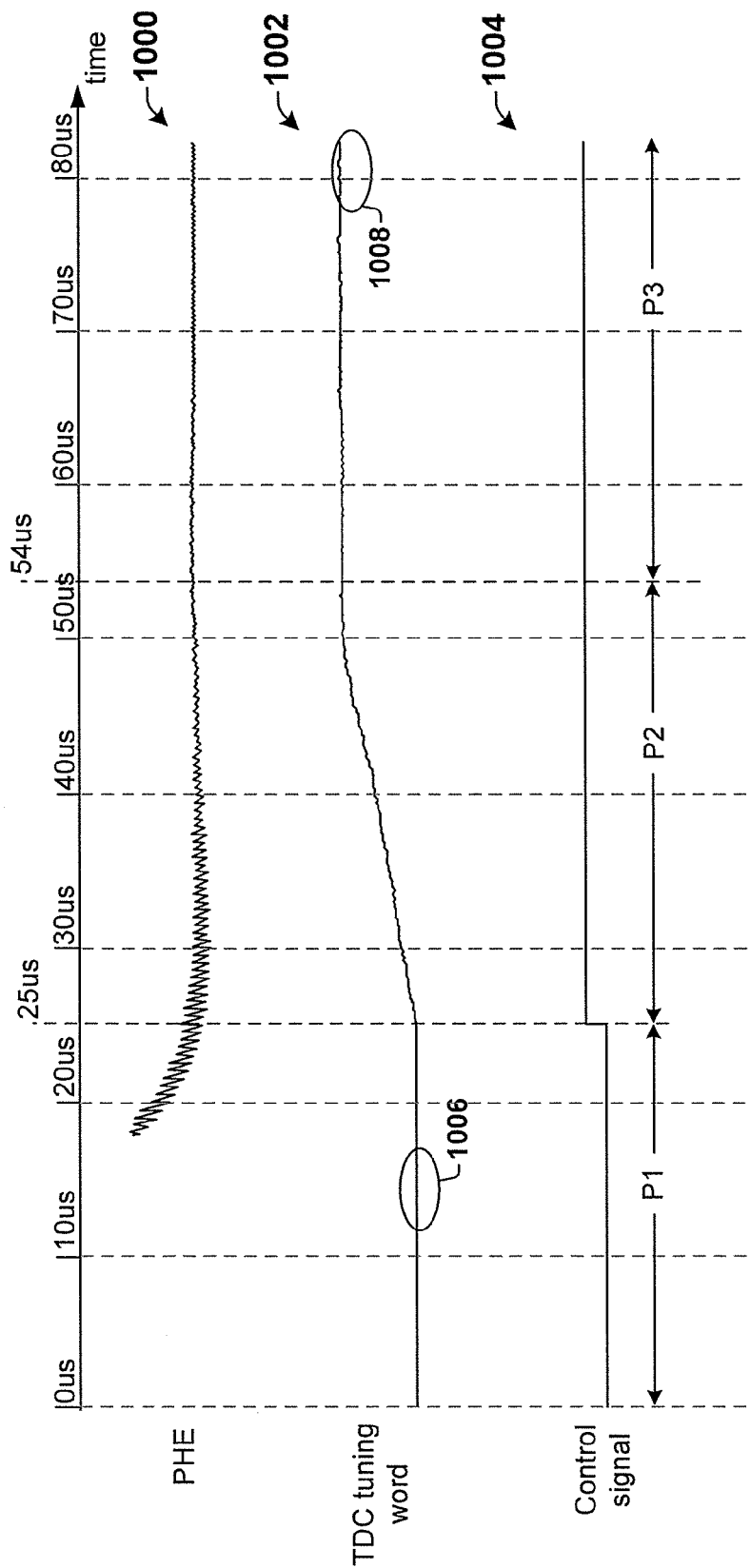
FIG. 10 is a timing diagram showing simulation results of some embodiments of an operation of a disclosed APDLL in accordance with the method of FIG. 9.

FIG. 10 illustrates timing diagrams 1000-1004 showing simulation results of some embodiments of an operation of a disclosed APDLL in accordance with the method of FIG. 9.

A first time period, P1, extends from time t=0 us to time t=25 us. During the first time period, P1, a frequency command word (FCW) is set to a value and the APDLL is turned on (timing diagram 1000). Type-I APDLL settling quickly reduces the phase error PHE. The TDC tuning word has a value 1006 that provides for a resolution of 8.4 ps.

A second time period, P2, extends from time t=25 us to time t=53 us During the second time period, P2, a control signal changes values (timing diagram 1004) to turn on the TDC calibration. The TDC calibration causes the TDC tuning word (TTW) to increase to account for variations in PVT conditions (timing diagram 1002).

A third time period, P3, extends from time t=54 us to time t=85. During the third time period, P3, type-II ADPLL settling occurs. As shown in timing diagram 1000, the type-II settling causes the PHE to remain at a constant value. The constant value indicates that the phase has settled and that that PVT conditions have settled. Therefore, the TDC word (timing diagram 1002) is held at a constant value 1008. The constant value 1008 provides for a resolution of 7.0 ps.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to an all digital phase locked loop (APDLL) that can account for variations in PVT conditions, and a method of related method of formation.

In some embodiments, the present disclosure relates to an all digital phase locked loop (ADPLL). The APDLL comprises a controllable time-to-digital converter (TDC) configured to determine a phase difference between a frequency reference signal and a local oscillator clock signal and to generate a variable phase therefrom. The ADPLL further comprises a digitally controlled oscillator (DCO) configured to vary the phase of the local oscillator clock signal based upon the variable phase. The ADPLL further comprises a calibration unit configured to determine an effect of variations in PVT (process, voltage, and temperature) conditions based upon the variable phase, and to generate a TDC tuning word that adjusts a resolution of the controllable TDC to account for the effect of variations in PVT conditions In other embodiments, the present disclosure relates to an all digital phase locked loop (ADPLL). The ADPLL comprises a controllable time-to-digital converter (TDC) having a plurality of variable delay elements, wherein the controllable TDC is configured to determine a phase difference between a frequency reference signal and a local oscillator clock signal and to generate a variable phase therefrom. The ADPLL further comprises a phase detector configured to determine a phase error comprising a difference between the variable phase and a reference phase received from a reference phase accumulator. The ADPLL further comprises a digitally controlled oscillator (DCO) configured to vary the phase of the local oscillator clock signal based upon the phase error. The ADPLL further comprises a calibration unit configured to determine an effect of variations in PVT (process, voltage, and temperature) conditions based upon the phase error, and to generate a TDC tuning word that adjusts a delay introduced by one or more of the plurality of variable delay elements to mitigate an effect of the variations in PVT conditions.

In other embodiments, the present disclosure relates to a method. The method comprises providing power to an all digital phase locked loop (APDLL) comprising a controllable time-to-digital converter (TDC) comprising a plurality of variable delay element. The method further comprises operating the controllable TDC to determining a phase difference between a frequency reference signal and a local oscillator clock signal and to generate a variable phase therefrom. The method further comprises determining an effect of variations in PVT (process, voltage, and temperature) conditions based upon the phase error. The method further comprises generating a TDC tuning word that adjusts a resolution of the controllable TDC to mitigate an effect of the variations in PVT conditions.

What is claimed is:

1. An all digital phase locked loop (ADPLL), comprising:
   a controllable time-to-digital converter (TDC) configured to determine a phase difference between a frequency reference signal and a local oscillator clock signal and to generate a variable phase therefrom;
   a digitally controlled oscillator (DCO) configured to vary the phase of the local oscillator clock signal based upon the variable phase; and
   a calibration unit configured to determine an effect of variations in PVT (process, voltage, and temperature) conditions based upon the variable phase, and to generate a TDC tuning word that adjusts a resolution of the controllable TDC to account for the effect of variations in PVT conditions.

2. The ADPLL of claim 1, further comprising:
   a phase detector configured to determine a phase error comprising a difference between the variable phase and a reference phase received from a reference phase accumulator; and
   a digital loop filter is configured to receive a phase error and to generate a control word from the phase error, which controls operation of the DCO.

3. The ADPLL of claim 2, further comprising:
   a control unit configured to turn off power to the calibration unit if the phase error is within a first threshold value of an acceptable phase error.

4. The ADPLL of claim 2, further comprising:
   a memory element configured to store one or more TDC tuning words if the phase error is within a first threshold value of an acceptable phase error.

5. The ADPLL of claim 2, wherein the calibration unit is configured to vary the resolution of the controllable TDC in a manner proportional to the phase error.

6. The ADPLL of claim 2, wherein the calibration unit comprises:
   a multiplexor configured to receive the phase error and an inverted phase error having an opposite sign of the phase error;
   a logical NOR gate configured to generate a control signal provides an output of the multiplexor to a first filtering element configured to generate an error in the TDC tuning word; and
   a second filtering element configured to receive the error in the TDC tuning word and to generate an updated TDC tuning word from the error in the TDC tuning word.

7. The ADPLL of claim 2, wherein the digitally controlled TDC comprises:
   a TDC core configured to receive the TDC tuning word, the local oscillator clock signal, and the frequency reference signal, and to determine a time difference between the local oscillator clock signal and the frequency reference signal that varies as a function of the TDC tuning word; and
   a normal TDC configured to compare an output of the TDC core to a target resolution, wherein if the target resolution is not equal to the TDC resolution the normal TDC varies a value of the variable phase based upon the comparison.

8. The ADPLL of claim 7, wherein the TDC core comprises:
- a first delay chain comprising a plurality of delay elements connected in series, wherein the first delay chain is configured to receive the frequency reference signal;
- a second delay chain comprising a plurality of delay elements connected in series, wherein the second delay chain is configured to receive the local oscillator clock signal;
- a variable delay chain connected in parallel with the second delay chain and comprising a plurality of programmable delay elements; and
- a variable capacitor chain connected in parallel with the second delay chain and comprising a plurality of switchable capacitors.

9. The ADPLL of claim 8, wherein:
the TDC tuning word is configured to selectively operate a number of the programmable delay elements or the digitally controlled switch capacitors to vary achieve a resolution corresponding to the phase error.

10. The ADPLL of claim 7, wherein the TDC core comprises:
- a first delay chain comprising a plurality of delay elements connected in series, wherein the first delay chain is configured to receive the clock signal;
- a second delay chain comprising a plurality of delay elements connected in series, wherein the second delay chain is configured to receive the reference signal;
- a variable delay chain connected in parallel with the second delay chain and comprising a plurality of programmable delay elements; and
- a variable capacitor chain connected in parallel with the second delay chain and comprising a plurality of switchable capacitors.

11. The ADPLL of claim 1,
wherein the controllable time-to-digital converter (TDC) comprises a plurality of variable delay elements; and
wherein the calibration unit is configured to vary the resolution of the controllable TDC by adjusting a value of a delay introduced by one or more of the plurality of variable delay elements.

12. The APDLL of claim 1, wherein the calibration unit is configured to determine a number of stages by dividing a maximum period of the DCO by a target TDC resolution.

13. An all digital phase locked loop (ADPLL), comprising:
- a controllable time-to-digital converter (TDC) having a plurality of variable delay elements, wherein the controllable TDC is configured to determine a phase difference between a frequency reference signal and a local oscillator clock signal and to generate a variable phase therefrom;
- a phase detector configured to determine a phase error comprising a difference between the variable phase and a reference phase received from a reference phase accumulator;
- a digitally controlled oscillator (DCO) configured to vary the phase of the local oscillator clock signal based upon the phase error; and
- a calibration unit configured to determine an effect of variations in PVT (process, voltage, and temperature) conditions based upon the phase error, and to generate a TDC tuning word that adjusts a delay introduced by one or more of the plurality of variable delay elements to mitigate the effect of the variations in PVT conditions.

14. The ADPLL of claim 13, wherein the TDC tuning word comprises a multi-bit digital word.

15. A method, comprising:
providing power to an all digital phase locked loop (APDLL) comprising a controllable time-to-digital converter (TDC) comprising a plurality of variable delay element;
operating the controllable TDC to determining a phase difference between a frequency reference signal and a local oscillator clock signal and to generate a variable phase therefrom;
determining an effect of variations in PVT (process, voltage, and temperature) conditions based upon the variable phase; and
generating a TDC tuning word that adjusts a resolution of the controllable TDC to mitigate an effect of the variations in PVT conditions.

16. The method of claim 15, wherein the TDC tuning word adjusts a delay introduced by one or more of the plurality of variable delay elements within the controllable TDC to mitigate the effect of the variations in PVT conditions.

17. The method of claim 16, further comprising:
determining a maximum period of a digitally controlled oscillator configured to generate the local oscillator clock signal;
determining a target TDC resolution; and
dividing the maximum period of the digitally controlled oscillator by the target resolution to determine a number of active variable delay elements in the controllable TDC.

18. The method of claim 15, further comprising:
determining a phase error comprising a difference between the variable phase and a reference phase received from a reference phase accumulator; and
determining a value of the TDC tuning word based upon the phase error.

19. The method of claim 18, wherein the resolution is adjusted in a manner proportional to the phase error.

20. The method of claim 18, further comprising:
storing the TDC tuning word if the phase error is within a first threshold value of an acceptable phase error.

* * * * *